(12) United States Patent
Kim et al.

(10) Patent No.: US 8,691,325 B2
(45) Date of Patent: Apr. 8, 2014

(54) DYE-SENSITIZED SOLAR CELL BASED ON ELECTROSPUN ULTRA-FINE TITANIUM DIOXIDE FIBERS AND FABRICATION METHOD THEREOF

(75) Inventors: Dong-Young Kim, Seoul (KR); Seong-Mu Jo, Seoul (KR); Wha-Seop Lee, Seoul (KR); Mi-Yeon Song, Seoul (KR); Do-Kyun Kim, Seoul (KR)

(73) Assignee: Korean Institute of Science and Technology, Seoul (KR)

( * ) Notice: Subject to any disclaimer, the term of this patent is extended or adjusted under 35 U.S.C. 154(b) by 778 days.

(21) Appl. No.: 12/779,012

(22) Filed: May 12, 2010

(65) Prior Publication Data
US 2010/0221863 A1 Sep. 2, 2010

Related U.S. Application Data

(62) Division of application No. 10/971,236, filed on Oct. 22, 2004, now abandoned.

(30) Foreign Application Priority Data

Oct. 31, 2003 (KR) .................................. 2003/76964

(51) Int. Cl.
*B05D 5/12* (2006.01)
(52) U.S. Cl.
USPC .......................................... 427/74; 427/372.2
(58) Field of Classification Search
USPC .............................................................. 427/74
See application file for complete search history.

(56) References Cited

U.S. PATENT DOCUMENTS

| | | | |
|---|---|---|---|
| 5,789,592 A * | 8/1998 | Gratzel et al. | 546/21 |
| 2001/0045547 A1 * | 11/2001 | Senecal et al. | 252/501.1 |
| 2002/0139688 A1 | 10/2002 | Okura et al. | |
| 2003/0013008 A1 * | 1/2003 | Ono | 429/111 |
| 2003/0056821 A1 | 3/2003 | Chittibabu et al. | |
| 2003/0155004 A1 | 8/2003 | Takahashi et al. | |
| 2003/0188777 A1 | 10/2003 | Gaudiana et al. | |
| 2004/0092195 A1 * | 5/2004 | Marks et al. | 445/24 |
| 2004/0118448 A1 * | 6/2004 | Scher et al. | 136/252 |
| 2004/0137225 A1 | 7/2004 | Balkus et al. | |

FOREIGN PATENT DOCUMENTS

| | | | |
|---|---|---|---|
| EP | 1 087 446 | * | 3/2001 |
| EP | 1087446 A2 | | 3/2001 |
| WO | WO 98/50393 A1 | | 11/1998 |

OTHER PUBLICATIONS

Li et al. "Fabrication of Titania Nanofibers by Electrospinning", Jan. 2003.*

(Continued)

*Primary Examiner* — Michael Cleveland
*Assistant Examiner* — Austin Murata
(74) *Attorney, Agent, or Firm* — NSIP Law

(57) ABSTRACT

A dye-sensitized solar cell comprising a semiconductor electrode comprising electrospun ultra-fine titanium dioxide fibers and fabrication method thereof are disclosed. The dye-sensitized solar cell comprises a semiconductor electrode comprising an electrospun ultra-fine fibrous titanium dioxide layer, a counter electrode and electrolyte interposed therebetween. A non-liquid electrolyte such as polymer gel electrolyte or the like having low fluidity, as well as the liquid electrolyte, can be easily infiltrated thereinto. In addition, electrons can be effectively transferred since titanium dioxide crystals are one-dimensionally arranged.

10 Claims, 5 Drawing Sheets

(56) References Cited

OTHER PUBLICATIONS

Brian O'Regan, et al., "A low-cost, high-efficiency solar cell based on dye-sensitized colloidal $TiO_2$ films," *Letters to Nature*, vol. 353, Oct. 24, 1991, pp. 737-740.

Meng, Q-B., et al., "Fabrication of an Efficient Solid-State Dye-Sensitized Solar Cell," *Langmuir*, vol. 19, Mar. 29, 2003, pp. 3572-3573.

Ileperuma, O.A., et al., "Dye-sensitized photoelectrochemical solar cells with polyacrylonitrile based solid polymer electrolytes", *Electrochimica Acta*, vol. 47, 2002, pp. 2801-2807.

Kubo, Wataru, et al., "Photocurrent-Determining Processes in Quasi-Solid-State Dye-Sensitized Solar Cells Using Ionic Gel Electrolytes", *J. Phys. Chem. B*, vol. 107, No. 18, 2003, pp. 4374-4381.

Wang, Peng, et al., "Gelation of Ionic Liquid-Based Eectrolytes with Silica Nanoparticles for Quasi-Solid-State Dye-Sensitized Solar Cells", *J. Am. Chem. Soc.*, vol. 125, No. 5, 2003, pp. 1166-1167.

Huynh, Wendy U., "Hybrid Nanorod-Polymer Solar Cells", *Science*, vol. 295, Mar. 29, 2002, pp. 2425-2427.

Matsumoto, Kajime, et al., "The Application of Room Temperature Molten Salt with Low Viscosity to the Electrolyte for Dye-Sensitized Solar Cell", *Chemistry Letters*, 2001 pp. 26-27.

Kubo, Wataru, et al. "Quasi-Solid-State Dye-Sensitized Solar Cell with Ionic Polymer Electrolyte" Chemistry Letters, 2002, pp. 948-949.

Li, Dan, et al., "Fabrication of Titania Nanofibers by Electrospinning," Nano Letters, 2003, pp. 555-560, vol. 3, No. 4.

Limmer, Steven J., et al., "Sol-Gel Electrophoretic Deposition for the Growth of Oxide Nanorods," Advanced Materials, 2003, pp. 427-431, vol. 15, No. 5.

SOng, Mi Yeon, et al., "Electrospun $TiO_2$ electrodes for dye-sensitized solar cells," Nanotechnology, 2004, pp. 1861-1865, vol. 15.

European Search Report issued on Jun. 17, 2011, in counterpart European Patent Application No. 04256687 (4 pages, in English).

\* cited by examiner

DYE-SENSITIZED SOLAR CELL BASED ON ELECTROSPUN ULTRA-FINE TITANIUM DIOXIDE FIBERS AND FABRICATION METHOD THEREOF

This application is a divisional application of U.S. application Ser. No. 10/971,236, filed on Jan. 16, 2007, which claims the benefit of Korean Patent Application No. 76964/2003, filed on Oct. 31, 2003, the entire disclosure of each of which is incorporated herein by reference for all purposes.

BACKGROUND OF THE INVENTION

1. Field of the Invention

The present invention relates to a dye-sensitized solar cell to convert solar energy into electric energy by a photo-electrochemical process and to a fabrication method thereof, and particularly, to a dye-sensitized solar comprising a semiconductor electrode consisting of electrospun ultra-fine titanium dioxide fibers and to a fabrication method thereof.

2. Description of the Background Art

Since Grätzel's research group in Swiss has reported a dye-sensitized solar cell (B. O'Regan, M. Grätzel, Nature 353, 737 (1991)), researches thereinto have been actively conducted. The dye-sensitized solar cell by Grätzel et al. is a photo-electrochemical solar cell using an oxide semiconductor electrode comprising photosensitive dye molecules that can absorb light within visible region, thereby to generate an electron-hole pair and nano crystalline titanium dioxide that can transfer the generated electron. In this cell, electrons excited in dye molecules upon receiving light within visible region are transferred to titanium dioxide which is an n-type semiconductor, and dye molecules are reproduced through an electrochemical oxidation-reduction of $I^-/I_3^-$ contained in a liquid electrolyte, by which current is generated.

The dye-sensitized solar cell is much expected as a solar light conversion element due to its higher energy conversion efficiency, while its fabrication cost is relatively low compared to a conventional silicon solar cell.

However, because dye-sensitized solar cells provided until now include a liquid electrolyte, stability problems have been raised, and especially, because it is difficult for such solar cells to be sealed, the liquid electrolyte can be leaked or an electrochemical stability cannot be ensured in using the same for a long time. Recently, in order to resolve such problems, researches have been actively conducted for using an inorganic solid electrolyte (Langmuir 19, 3572 (2003)), a polymer solid electrolyte (Electrochemica Acta 47, 2801 (2002)), a gel electrolyte (J. Phys, Chem. B 107, 4374 (2003)), an ionic liquid (J. Am. Chem. Soc. 125, 1166 (2003)), an organic hole carrier (Science 295, 2425 (2002)) or the like, instead of using a liquid electrolyte. However, while a liquid electrolyte can easily infiltrate throughout an entire electrode plate having a thickness of 10 μm or more which is fabricated by sintering nanocrystalline titanium dioxide particles, it is difficult for a non-liquid electrolyte to infiltrate into such electrode plate, and therefore, energy conversion efficiency is lowered for cells using a non-liquid electrolyte compared to those using a liquid electrolyte (Chem. Lett. 30, 26 (2001); 31, 948 (2002)). Although a cell construction using a porous titanium dioxide thin film based on a sol-gel method or particles in rod shape has been proposed as a solution for such problems, it has been known that its performance is much inferior compared to the conventional nano-particle type. Therefore, there are problems yet to be solved.

SUMMARY OF THE INVENTION

Therefore, one object of the present invention is to provide a dye-sensitized solar cell comprising a semiconductor electrode consisting of electrospun ultra-fine fibrous crystalline titanium dioxide, which can solve electron mobility problems throughout particles occurring in the conventional dye-sensitized solar cell using an electrode made of sintered nanocrystalline titanium dioxide, and which can also improve adhesiveness with solid electrolyte and element characteristics.

Another object of the present invention is to provide a method for fabricating the dye-sensitized solar cell comprising electrospun ultra-fine fibrous titanium dioxide.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3B: after pre-treatment but before thermal treatment; and FIG. 3C: after thermal treatment);

FIG. 5B: with performing pre-treatment);

Figure 1:
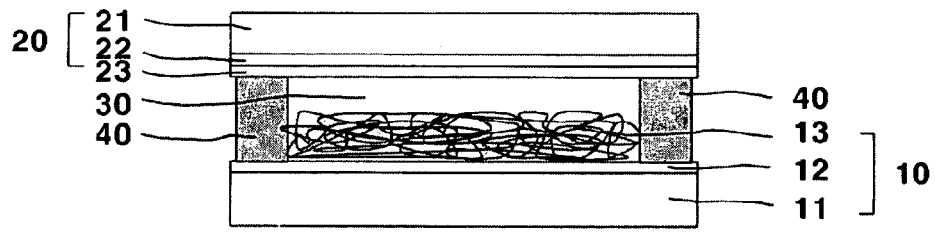
FIG. 1 illustrates the construction of a dye-sensitized solar cell in accordance with the present invention.

10: Electrode
11, 21: Glass
12, 22: Transparent FTO conductive layer
13: Electrospun titanium dioxide layer
20: Counter electrode
23: Pt layer
30: Electrolyte
40: Spacer

DETAILED DESCRIPTION OF THE PREFERRED EMBODIMENTS

The inventors of the present invention has made great efforts to solve the problems in the conventional dye-sensitized solar cell and finally developed an semiconductor electrode consisting of an electrospun ultra-fine fibrous titanium dioxide, so as to provide a new dye-sensitized solar cell having a titanium dioxide layer in one dimensional structure that can facilitate infiltration of a non-liquid electrolyte and can effectively transfer electrons.

To achieve the above-mentioned objects and other advantages in accordance with the present invention, as embodied and broadly described herein, there is provided a dye-sensitized solar cell comprising a semiconductor electrode containing an electrospun ultra-fine fibrous titanium dioxide layer; a counter electrode; and electrolyte infiltrated between the semiconductor electrode and the counter electrode.

The semiconductor electrode consists of a glass substrate, ITO or FTO transparent conductive layer, and an electrospun ultra-fine fibrous titanium dioxide layer onto which dye molecules are adsorbed. The electrospun ultra-fine fibrous titanium dioxide layer has a thickness of 5-20 µm.

The counter electrode can include a glass substrate, ITO or FTO transparent conductive layer and a platinum layer.

The electrolyte is a liquid electrolyte containing iodine, and preferably, an electrolyte of 0.1M lithium iodide (Lip, 0.05M iodine ($I_2$), 0.6M 1,2-dimethyl-3-propyl-imidazolium iodide and 0.5 M tert-butyl pyridine in acetonitrile, or a polymer gel electrolyte containing at least one polymers selected from the group consisting of poly(vinylidenefluoride)-co-poly(hexafluoropropylene), poly(acrylonitrile), poly(ethyleneoxide) and poly(alkylacrylate). Preferably, the polymer gel electrolyte contains one or more polymers as mentioned above in an amount of 5-20% by weight of a mixture of propylene carbonate and ethylene carbonate.

To achieve another object of the invention, there is also provided a method for fabricating a dye-sensitized solar cell comprising the steps of:

adding titanium isopropoxide into a polymer solution, followed by adding acetic acid as a catalyst therein, and then stirring the resulting mixture at room temperature, to obtain a solution for electrospinning;

electrospinning the solution to form a film made of ultra-fine titanium dioxide fibers onto an ITO or FTO-coated transparent conductive glass substrate;

pre-treating the substrate having the film comprising the ultra-fine titanium dioxide fibers formed thereon with acetone or dimethyl formamide;

thermally treating the pre-treated substrate to form a layer of the ultra-fine fibrous titanium dioxide onto the substrate;

impregnating the thermally treated substrate in a solution of dye molecules in ethyl alcohol, to obtain a semiconductor electrode in which the dye molecules are adsorbed into the electrospun ultra-fine titanium dioxide fibers;

coating a platinum layer onto an ITO or FTO-coated transparent conductive glass substrate, to obtain a counter electrode;

performing a heating/pressing process on the semiconductor electrode and the counter electrode in which a spacer having a thickness of 20 µm is located therebetween, so as to attach the above two electrodes to each other; and injecting an electrolyte into the empty space between the semiconductor electrode and the counter electrode.

The ultra-fine titanium dioxide fibers are electrospun so as to have 50-1000 nm in thickness.

The pre-treatment can be performed such a manner that i) the substrate is pre-processed with vapor of acetone or dimethylformamide for 1-3 hours in a closed container; ii) the substrate is immersed in acetone or dimethylformamide solvent for 1 hour, or iii) methods i) and ii) are combined. Preferably, the thermal treatment is performed at 450° C.-500° C. for 30 minutes.

Below, the present invention will be described in more detail by referring to the attached drawings.

FIG. 1 illustrates the construction of a dye-sensitized solar cell comprising a semiconductor electrode consisting of electrospun ultra-fine titanium dioxide fibers in accordance with the present invention.

With reference to FIG. 1, the dye-sensitized solar cell comprises a semiconductor electrode 10, a counter electrode 20 and an electrolyte 30 interposed therebetween.

The semiconductor electrode 10 comprises a glass substrate 11, an indium tin oxide (ITO) or fluorine-doped tin oxide (FTO) transparent conductive layer 12 and an electrospun ultra-fine fibrous titanium dioxide layer 13. The ultra-fine fibrous titanium dioxide layer 13 includes ultra-fine titanium dioxide fibers having a diameter of about 50-1000 nm which are formed with a bunch of fine fibrils having a thickness of about 10-30 nm one-dimensionally arranged by electrospinning. In order to effectively generate photocurrent, the titanium dioxide layer 13 preferably has a thickness of about 5-20 µm. Ruthenium-based dye molecules are adsorbed onto the ultra-fine titanium dioxide fibers.

The counter electrode 20 comprises a glass substrate 21, an ITO or FTO transparent conductive layer 22 and a platinum layer 23. The platinum layer 23 of the counter electrode 20 is disposed to face the fibrous titanium dioxide layer 13 of the semiconductor electrode 10.

As the electrolyte 30 filled in the space between the semiconductor electrode 10 and the counter electrode 20, an electrolyte solution of $I_3^-/I^-$ in which 0.1M lithium iodide (Lil), 0.05M iodine ($I_2$), 0.6M 1,2-dimethyl-3-propyl-imidazolium iodide and 0.5M tert-butyl pyridine are dissolved in acetonitrile. Alternatively, instead of the liquid electrolyte, a polymer gel electrolyte in which one or more polymers selected from the group consisting of poly(vinylidenefluoride)-co-poly (hexafluoropropylene), poly(acrylonitrile), poly-(ethyleneoxide) and poly(alkylacrylate) are contained in an amount of 5-20% by weight of a mixture of propylene carbonate and ethylene carbonate can be used.

A method for fabricating a dye-sensitized solar cell comprising a semiconductor electrode consisting of electrospun ultra-fine titanium dioxide fibers in accordance with the present invention will be described below.

In order to fabricate the semiconductor 10, an anode, the electrospun ultra-fine titanium dioxide fibers are fabricated.

To begin with, a solution for an electrospinning is prepared by a sol-gel reaction of titanium isopropoxide. In detail, polyvinylacetate having an excellent affinity to titanium dioxide is dissolved in dimethylformamide, acetone, tetrahydrofuran, toluene or a mixture thereof, to prepare a 5-20 wt % polymer solution to be able to give a viscosity suitable for electrospinning. Polyvinylacetate having a weight average molecular weight of 100,000-1,000,000 g/mol is used. Instead of polyvinylacetate, polyvinylpyrrolidone, polyvinylalcohol, polyethyleneoxide and the like can be used to prepare a polymer solution. Next, titanium isopropoxide is added into the polyvinylacetate polymer solution in an amount of 5-25 wt % of the polyvinylacetate polymer solution, to which acetic acid is added as a catalyst in an amount of 20-60 wt % of the titanium isopropoxide. The resulting mixture was then reacted for 1-5 hours at room temperature so as to obtain a solution for electrospinning. This solution is required to maintain a suitable viscosity required for electrospinning. After being spun into fibers, the polymer is completely decomposed by a thermal treatment at 450° C. or higher, and residual titanium dioxide is converted into an anatase type crystal structure.

Figure 2:
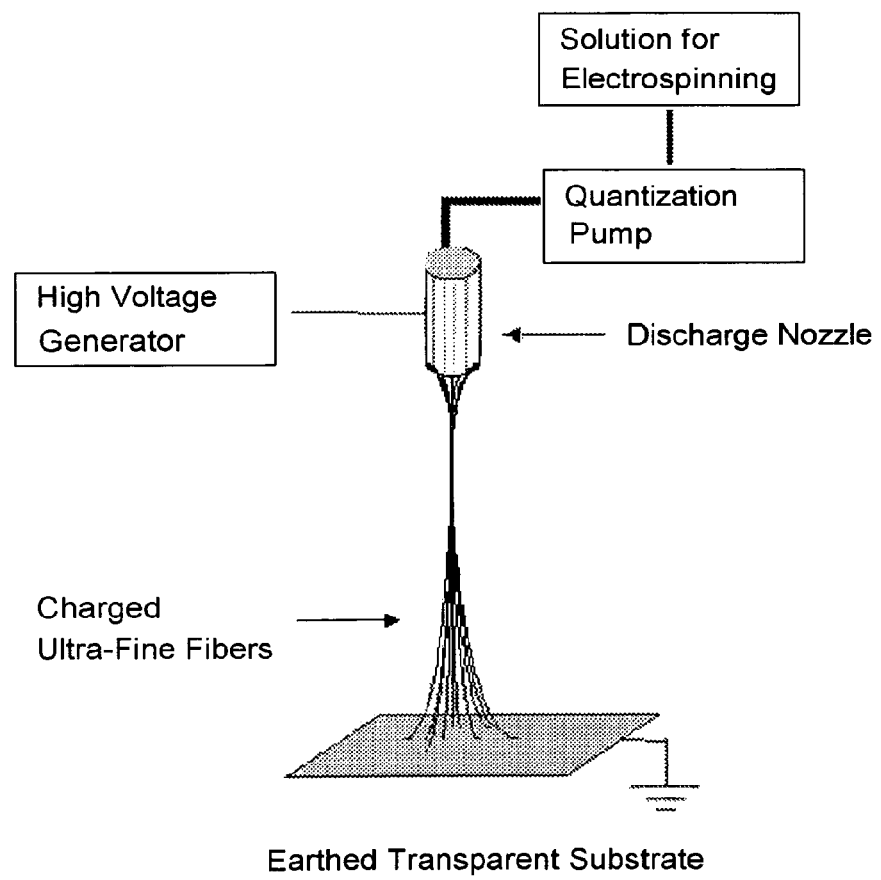
FIG. 2 is a schematic view of a general type of an electrospinning apparatus.

And then, electrospun ultra-fine titanium dioxide fibers are obtained with an electrospinning apparatus. As shown in FIG. 2, a generally used electrospinning apparatus includes a spinning nozzle connected to a quantizing pump that can introduce a solution to be spun quantitatively, a high voltage generator, an electrode for forming a layer of fibers to be spun. An earthed transparent conductive glass substrate, specifically a transparent conductive glass substrate onto which ITO or FTO are coated and which have conductivity of 5-30 Ω is used as an anode, and the spinning nozzle equipped with a pump which can control discharging amount per time is used as a cathode. 10-30 KV of voltage is applied and a solution discharge rate is adjusted at 10-50 µl/min, so as to obtain ultra-fine titanium dioxide fibers having a thickness of 50-1,000 nm. Electrospinning is continued until a film consisting of ultra-fine titanium dioxide fibers at a thickness of 5-20 µm is formed onto the transparent conductive substrate. By adjusting discharging amount and voltage, the thickness and form of the fiber can be controlled. In addition, in order to uniformly maintain the thickness of the film entirely, it is preferred to use a robot system which can repeatedly moves the position of the electrospinning nozzle.

Thereafter, before thermal treatment, a pre-treatment is performed such that the transparent conductive substrate, onto which the film made of the electrospun ultra-fine titanium dioxide fibers is formed, is treated with vapor of acetone or dimethylformamide, which has been used as solvent for the polymer solution, for 1-3 hours in a closed container or immersed the substrate in acetone or dimethyl formamide for 1 hour. The electrospun ultra-fine titanium dioxide fibers are in the form of a film mixed with a polymer on the substrate (referred to as 'polymer-titanium dioxide composite film', hereinafter). Thus, in order to obtain the semiconductor electrode in accordance with the present invention, it is necessary for the substrate on which electrospun titanium dioxide film is formed to be subjected to a thermal treatment at a temperature of 450° C. or higher, thereby to remove the polymer binder completely and to convert residual ultra-fine titanium dioxide fibers into anatase type crystal structure. However, if a polymer-titanium dioxide composite film formed by a conventional electrospinning is thermally treated at such a high temperature in the air, the transparent conductive substrate and the titanium dioxide film are separated (refer to FIG. 5A), and therefore, it can not be used as an electrode for a preferable dye-sensitized solar cell.

Figure 5A:
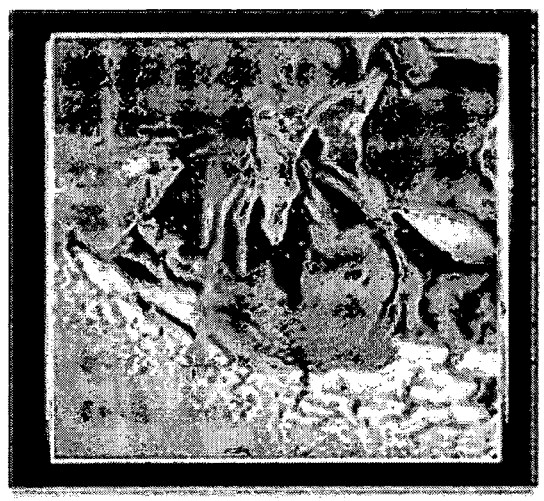
FIGS. 5A and 5B are photographs of a transparent conductive substrate after thermal treatment, on which an electrospun ultra-fine fibrous titanium dioxide layer was formed in accordance with the present invention (FIG. 5A: without performing pre-treatment.
Figure 5B:
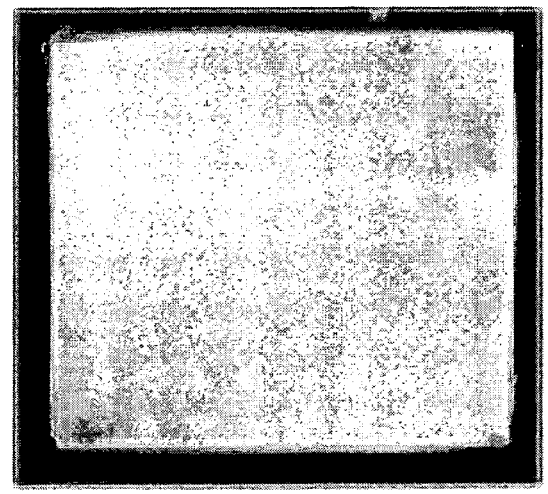

Therefore, in the present invention, the polymer-titanium dioxide composite film formed by electrospinning is subjected to a pre-treatment so as to form a firm titanium dioxide film (refer to FIG. 5B). The pre-treatment is to dissolve the polymer portion of the polymer-titanium dioxide composite fibers by treat the electrospun ultra-fine titanium dioxide fibers in which polymer and titanium dioxide are mixed (referred to as 'polymer-titanium dioxide composite fiber', hereinafter) with a solvent. During this process, adhesiveness among fibers can be increased, while the fibrous form of the titanium dioxide is maintained as it is, so that its adhesiveness to the lower transparent conductive substrate can be increased. As stated above, the pre-treatment includes the method of treating the electrospun polymer-titanium dioxide composite film with vapor of acetone or dimethylformamide used as a solvent for the polymer solution for 1-3 hours, the method of immersing the electrospun polymer-titanium dioxide composite film in acetone or dimethyl formamide, and the method of employing both methods. In the aspect of efficiency, it is preferred to use the third method in a manner that the electrospun polymer-titanium dioxide composite film is treated with vapor and then immersed in the solvent.

The pre-processed transparent conductive substrate is thermally treated at 450-500° C. for 30 minutes in the air to thermally decompose residual polymer so as to completely remove the same, by which crystalline structure of the titanium dioxide is converted into anatase type.

And then, the substrate, on which the film made of the electrospun titanium fibers is formed, is impregnated in a solution in which a Ruthenium-based dye molecules, for example, dye molecules represented by a structural formula of $RuL_2(NCS)_2$, wherein L=2,2'-bipyridyl-4,4'-dicarboxyl acid, is dissolved in ethyl alcohol in a concentration of $3\times10^{-4}$M for 12 hours or more, to adsorb the dye molecules therein. The substrate was then washed with ethyl alcohol and then dried, to obtain the semiconductor electrode 10 comprising dye-adsorbed electrospun ultra-fine titanium dioxide fibers.

Subsequently, in order to fabricate the counter electrode 20, which is a cathode, the platinum layer 23 is coated onto an ITO or FTO-coated transparent conductive glass substrate.

And then, the counter electrode 20, the cathode, and the semiconductor electrode 10, the anode, are assembled such that each conductive surface of the cathode and anode comes inward so as to make the platinum layer 23 and the fibrous titanium dioxide layer 13 faced with each other. At this time, the two electrodes are attached with a spacer 40 having a thickness of about 20 µm, which is made of a thermoplastic Surlyn™ (available from Du Pont Co.) and inserted the above two electrodes.

Thereafter, a liquid electrolyte or polymer gel electrolyte is filled in spaces between the two electrodes. As mentioned above, as the liquid electrolyte, the electrolyte solution of $I_3^-/I^-$ obtained by dissolving 0.1M of lithium iodine (LiI), 0.05M of iodine ($I_2$), 0.6M of 1,2-dimethyl-3-propyl-imidazolium iodide and 0.5M of tert-butyl pyridine in acetonitrile. As the polymer gel electrolyte, a mixture obtained by dissolving one or more polymers selected from the group consisting of poly(vinylidenefluoride)-co-poly(hexafluoropropylene), poly(acrylonitrile), poly(ethyleneoxide) and poly(alkylacrylate) in a mixture of propylene carbonate and ethylene carbonate in amount of 5-20 wt % of the solvent mixture can be used.

The present invention will be explained in more detail in the following examples. It is to be understood that these examples are merely illustrative and it is not intended to limit the scope of the present invention to these examples, and they can be modified by the ordinary person skilled in the art within the scope.

EXAMPLE

Example 1

Fabrication of an Electrospun Titanium Dioxide Fiber Layer 6 g of titanium isopropoxide was slowly added in a polymer solution in which 30 g of polyvinylacetate (Mw 500,000, a product of Aldrich Co.) was dissolved in a 270 m of acetone and 30 ml of dimethylformamide mixed solvent. As the reaction was initiated by moisture contained in the solvent, the reaction mixture was changed into a suspension. 2.4 g of acetic acid was then slowly added dropwise as a reaction catalyst to the reaction mixture. As the reaction was proceeding, the suspension was changed into a clear solution. The resulting spinning solution should be spun to ultra-fine titanium dioxide fibers within 24 hours once it was prepared, because if it is left for a long time after the acetic acid was added, the solution is changed into a dark brown color due to hydrolysis of the polymer.

Electrospinning was performed with the electrospinning apparatus shown in FIG. 2, wherein a FTO-coated transparent conductive substrate (having the size of 10 cm×10 cm) was used as a cathode and a metallic needle (No. 24) having a pump, which can control discharge rate, attached thereto was used as an anode, to which 15 kV of voltage was applied. While discharge rate of the spinning is solution was maintained at 30 μl/min, electrospinning was performed until the total discharge amount of the spinning solution reaches 5,000 μl, to form a layer of ultra-fine titanium dioxide fibers onto the FTO-coated transparent conductive substrate.

Example 2

Pre-Treatment and Thermal Treatment of the Substrate on Which a Layer of Titanium Dioxide Fibers was Formed Fabricated in Example 1

The layer of titanium dioxide fibers fabricated in Example 1 includes polymer and titanium dioxide mixed therein. Thus, in order to use the polymer-titanium dioxide composite film-formed substrate as a semiconductor electrode of a dye-sensitized solar cell, the substrate should be thermally treated at a high temperature to remove polyvinylacetate, a polymer binder, and the spun ultra-fine titanium dioxide fibers should be converted into a crystal form. However, if the substrate fabricated in Example 1 is thermally treated at a high temperature without pre-treatment, the titanium dioxide film would not be attached on the FTO-coated substrate but be separated therefrom, and thus, it cannot be used as a semiconductor electrode for a dye-sensitized solar cell.

Thus, before the thermal treatment, the substrate, on which the polymer-titanium dioxide composite film fabricated in Example 1 has been formed, was treated only with acetone vapor for 1 hour, without being directly contacted with acetone in a closed container, and then, thermally treated in an electric furnace of 450° C. in the air for 30 minutes, thereby to stably form titanium dioxide film on the FTO-coated transparent conductive substrate.

Figure 3A:
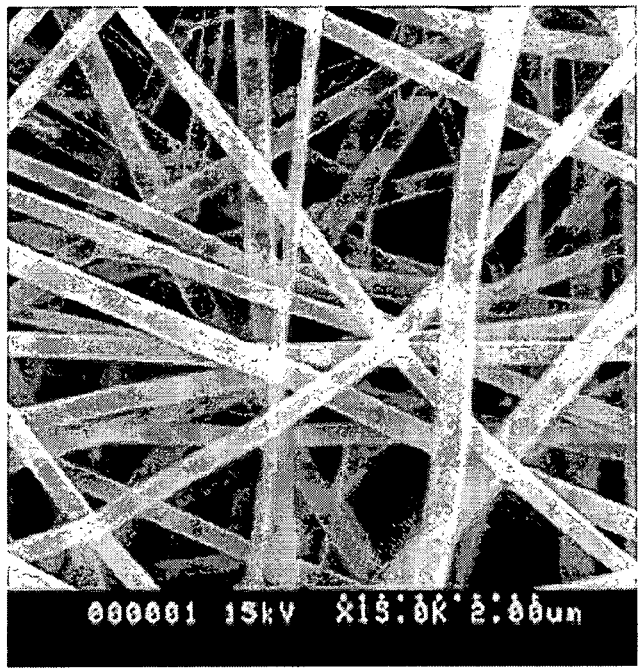
FIGS. 3A to 3C are scanning electron microscopic photographs of an electrospun ultra-fine fibrous titanium dioxide layer fabricated in accordance with the present invention (FIG. 3A: before pre-treatment.
Figure 3B:
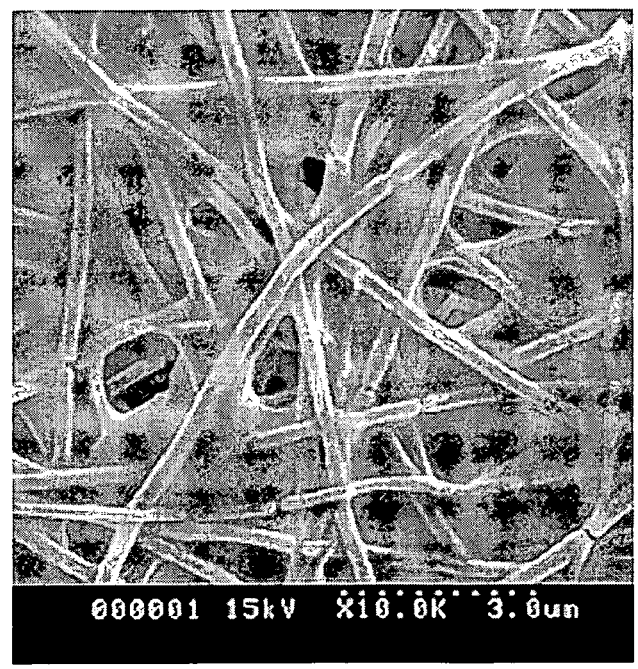
Figure 3C:
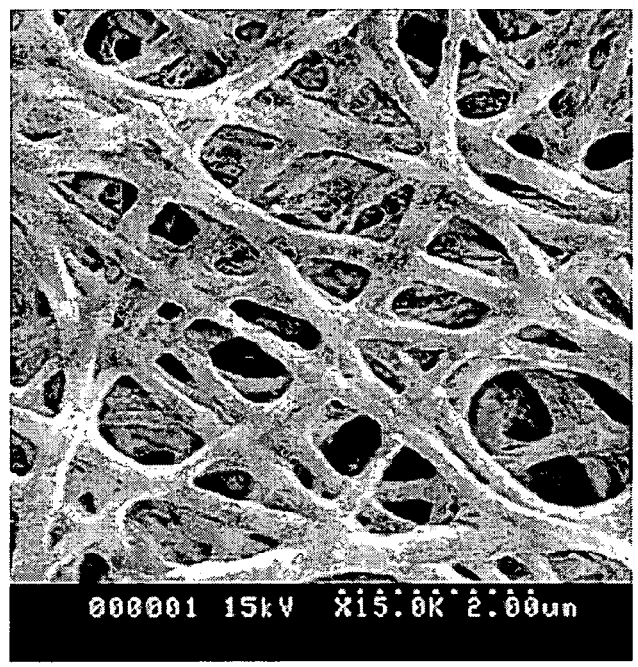

FIGS. 3A to 3C are scanning electron microscopic photographs of the electrospun titanium dioxide fiber layer in stages fabricated in accordance with the present invention. Specifically, FIG. 3A is a scanning electron microscopic photograph of the titanium dioxide fiber layer after electrospinning but before pre-treatment, FIG. 3B is a scanning electron microscopic photograph of the titanium dioxide fiber layer after pre-treatment, and FIG. 3C is a scanning electron microscopic photograph of the titanium dioxide fiber layer after pre-treatment and thermal treatment.

As shown in FIG. 3A, in the titanium dioxide fiber layer that was thermally treated without pre-treatment, individual fibers were fixed separately without being adhered to each other after thermal treatment. When the titanium dioxide fiber layer was subjected to the pre-treatment, fibers were well connected with each other to form a dense film as shown in FIG. 3B because the matrix polymer from fibers spun are partially dissolved.

The ultra-fine fibrous titanium dioxide layer obtained after the pre-treatment and subsequent thermal treatment shows that the layer of individual fibers were well adhered to each other, so as to enable electron transfer to be more effective in a solar cell device.

Figure 4:
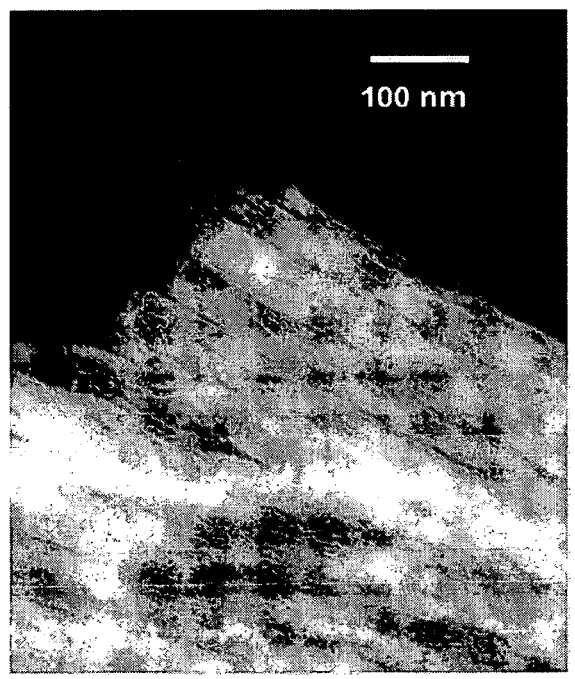
FIG. 4 is a transmission electron microscopic photograph of an electrospun ultra-fine fibrous titanium dioxide layer fabricated in accordance with the present invention.

FIG. 4 is a transmission electron microscopic photograph of the electrospun titanium dioxide fiber layer fabricated in accordance with the present invention, and especially shows fine structure of the ultra-fine titanium dioxide fibers remaining after removing polymer by the pre-treatment and subsequent thermal treatment at 450° C. As shown in FIG. 4, the fibrous titanium dioxide crystal arranged one-dimensionally increases movement photocurrent in the solar cell, which are intended by the present invention, thereby to remarkably improve performance of the element.

FIGS. 5A and 5B are photographs of transparent conductive substrate with the electrospun titanium dioxide fiber layer formed thereon after the substrate was thermally treated in accordance with the present invention. FIG. 5A is for the substrate without performing the pre-treatment thereon, and FIG. 5B is for the pre-treated substrate.

As shown in FIG. 5A, when the substrate was thermally treated at 450° C. without pre-treatment, the titanium dioxide film was separated from the substrate. On the contrary, when the substrates was pre-treated with vapor of acetone, followed by thermally treated, the titanium dioxide film was firmly formed on the substrate as shown in FIG. 5B.

Figure 6:
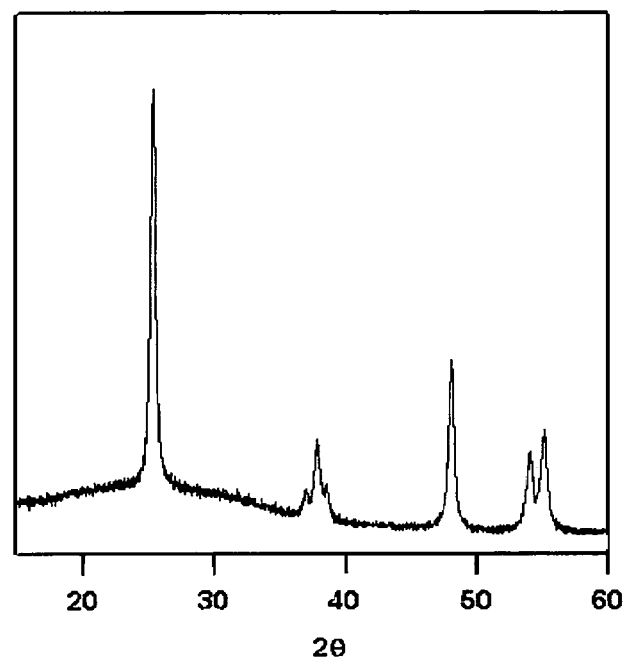
FIG. 6 is a graph showing X-ray diffraction peaks for an electrospun ultra-fine fibrous titanium dioxide prepared in accordance with the present invention after thermal treatment.

FIG. 6 is a graph showing X-ray diffraction peaks after the electrospun ultra-fine titanium dioxide fibers were thermally treated in accordance with the present invention. It can be seen from FIG. 6 that the crystalline structure of the titanium dioxide was converted into the anatase type after the thermal treatment.

Example 3

Fabrication of a Dye-Sensitized Solar Cell Using the Titanium Dioxide Fiber Layer Fabricated in Example 2

Dye molecules were adsorbed onto the ultra-fine titanium dioxide fibers in the substrate fabricated in Example 2. Specifically, the transparent conductive glass substrate fabricated in Example 2 was impregnated in $3 \times 10^{-4}$M solution of $RuL_2(NCS)_2$ (L=2,2'-bipyridyl-4,4'-dicarboxyl acid) (Ruthenium 535, available from Solaronix,), a ruthenium-based dye, in ethanol for 12 hours, so as to adsorb the dye molecules therein. The resulting substrate was washed with ethanol several times and then dried, thereby to give a semiconductor electrode. Separately, a platinum layer was coated onto a FTO-coated transparent conductive glass substrate to obtain a counter electrode.

Next, a spacer having a thickness of about 20 μm was located between the semiconductor electrode and the counter electrode fabricated as described above, and a certain pressure was applied thereto at 120° C. so as to attach the above two electrodes. Iodine-based liquid electrolyte was then filled in the space between the above two electrodes, and the resultant was sealed to obtain the dye-sensitized solar cell in accordance with the present invention. Liquid electrolyte used was prepared by dissolving 0.25 g of iodine, 0.26 g of lithium iodide, 3.70 g of 1,2-dimethyl-3-propyl-imidazolium iodide and 1.34 g of tert-butyl pyridine in 20 ml of acetonitrile.

Meanwhile, the dye-sensitized solar cell was also fabricated in the same manner as described in Example 1 to Example 3, except for using a polymer gel electrolyte instead of the liquid electrolyte. The polymer get electrolyte used in this case was prepared by dissolving 0.125 g of poly(vinylidene fluoride)-co-poly(hexafluoropropylene) (Kynar 2801), 0.13 g of 1-hexyl-2,3-dimethyl imidazolum iodide (Im), and 0.008 g of iodine in a mixture of 0.75 g of propylene carbonate and 0.5 g of ethylene carbonate at 80° C.

Figure 7:
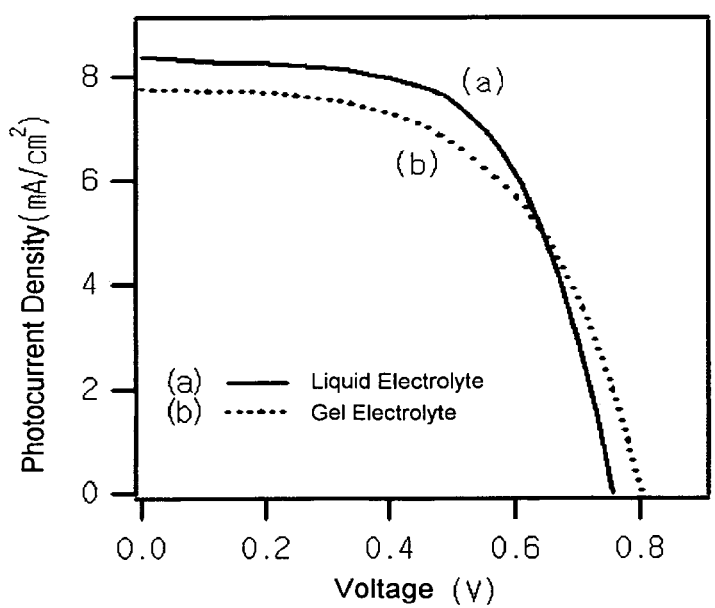
FIG. 7 is a graph showing current-voltage characteristics of a dye-sensitized solar cell in accordance with the present invention.

FIG. 7 is a graph showing current-voltage characteristics of the dye-sensitized solar cell fabricated in the above Examples in accordance with the present invention. As an electrolyte for the dye-sensitized solar cell, the liquid electrolyte and the gel electrolyte prepared as described in Example 3 were respectively used. Table 1 below shows photoelectrochemical characteristics which were calculated with current-voltage curves relative to the types of the electrolytes, namely, photocurrent density ($J_{sc}$), voltage ($V_{oc}$), fill factor (ff) and energy conversion efficiency ($\eta$).

TABLE 1

| Electrolytes | $J_{sc}$ (mA/cm$^2$) | $V_{oc}$ (V) | ff | $\eta$ (%) |
|---|---|---|---|---|
| Liquid electrolyte | 8.35 | 0.76 | 0.62 | 3.90 |
| Get electrolyte | 7.72 | 0.80 | 0.58 | 3.61 |

As can be seen from the above Table 1, the dye-sensitized solar cell comprising a semiconductor electrode consisting of the electrospun ultra-fine titanium dioxide fibers according to the present invention exhibits energy conversion efficiency of above 90% even in using gel electrolyte relative to that of the cell using liquid electrolyte.

As so far described, the dye-sensitized solar cell in accordance with the present invention comprises a semiconductor electrode comprising electrospun ultra-fine titanium dioxide fibers, and therefore, the non-liquid electrolyte such as a polymer gel electrolyte or the like having low fluidity, as well as a liquid electrolyte, can even be easily infiltrated thereinto. In addition, electrons can be effectively transferred because titanium dioxide crystals are arranged one-dimensionally.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for fabricating a dye-sensitized solar cell, comprising the steps of:
    (a) adding titanium isopropoxide into a polymer solution, followed by adding an acid as a catalyst thereinto, and then stirring the resulting mixture at room temperature, to obtain a solution for electrospinning;
    (b) electrospinning the solution to form a film made of ultra-fine polymer-titanium dioxide composite fibers onto an ITO-coated transparent conductive glass substrate or FTO-coated transparent conductive glass substrate;
    (c) pre-treating the substrate the film of the ultra-fine polymer-titanium dioxide composite fibers formed thereon with a solvent for pre-treatment which contains acetone or dimethyl formamide;
    (d) thermally treating the pre-treated substrate to form a layer of ultra-fine titanium dioxide fibers onto the substrate;
    (e) impregnating the thermally treated substrate in a solution of dye molecules to obtain a semiconductor electrode on which the dye molecules are adsorbed into the ultra-fine titanium dioxide fibers;
    (f) obtaining a counter electrode onto an ITO-coated transparent conductive glass substrate or FTO-coated transparent conductive glass substrate;
    (g) performing a heating/pressing process on the semiconductor electrode and the counter electrode with a spacer therebetween, so as to attach the semiconductor electrode and the counter electrode to each other; and
    (h) injecting electrolyte into empty space between the semiconductor electrode and the counter electrode.

2. The method according to claim 1, wherein the polymer solution is a solution in which at least one polymer selected from the group consisting of polyvinylacetate, polyvinylpyrolidone, polyvinylalcohol and polyethyleneoxide is dissolved in a solvent for polymer solution which contains any one selected from the group consisting of dimethyl formamide, acetone, tetrahydrofuran, toluene and mixtures thereof in an amount of 5-20 wt %.

3. The method according to claim 1, wherein the diameter of the ultra-fine titanium dioxide fiber is 50-1000 nm.

4. The method according to claim 3, wherein the ultra-fine titanium dioxide fiber is a bunch of fine fibrils having a thickness of about 10-30 nm.

5. The method according to claim 1, wherein the thickness of the layer of the ultra-fine fibrous titanium dioxide is 5-20 um after the step (d).

6. The method according to claim 1, wherein the step (c) is performed by a process comprising; i) treating the substrate with vapor of the solvent for pre-treatment for 1-3 hours in a closed container; ii) immersing the substrate in the solvent for pre-treatment for 1 hour or iii) treating the substrate with vapor of the solvent for pre-treatment in a closed container and then immersing the substrate in the solvent for pre-treatment.

7. The method according to claim 1, wherein the electrolyte is a liquid electrolyte or polymer gel electrolyte.

8. The method according to claim 1, wherein the counter electrode contains platinum.

9. The method according to claim 1, wherein the acid contains acetic acid.

10. The method according to claim 1, wherein the ultra-fine titanium dioxide fiber is a bunch of fine fibrils which are one-dimensionally arranged by the electrospinning.

* * * * *